(12) United States Patent
Yamazaki

(10) Patent No.: US 11,904,915 B2
(45) Date of Patent: Feb. 20, 2024

(54) ARTICLE TRANSPORT FACILITY

(71) Applicant: Daifuku Co., Ltd., Osaka (JP)

(72) Inventor: Takafumi Yamazaki, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 677 days.

(21) Appl. No.: 17/147,795

(22) Filed: Jan. 13, 2021

(65) Prior Publication Data

US 2021/0213983 A1 Jul. 15, 2021

(30) Foreign Application Priority Data

Jan. 14, 2020 (JP) ................................ 2020-003832

(51) Int. Cl.
| | |
|---|---|
| *B61L 23/04* | (2006.01) |
| *B65G 35/06* | (2006.01) |
| *B65G 43/00* | (2006.01) |
| *H01L 21/677* | (2006.01) |
| *B65G 35/00* | (2006.01) |
| *H01L 21/67* | (2006.01) |

(52) U.S. Cl.
CPC ............ *B61L 23/041* (2013.01); *B65G 35/00* (2013.01); *B65G 35/06* (2013.01); *B65G 43/00* (2013.01); *H01L 21/67259* (2013.01); *H01L 21/67733* (2013.01); *B61L 2201/00* (2013.01); *B65G 2203/0291* (2013.01); *B65G 2203/042* (2013.01)

(58) Field of Classification Search
CPC ........ B61L 23/041; B61L 23/00; B61L 23/04; B61L 2201/00; B65G 2203/042; B65G 35/00; B65G 35/06; B65G 43/00; B65G 2203/0291; B65G 2203/02; B65G 2203/04; H01L 21/67733; H01L 21/67259
See application file for complete search history.

(56) References Cited

U.S. PATENT DOCUMENTS

| 9,896,275 B2 * | 2/2018 | Ikenaga | ................. B65G 43/00 |
| 2017/0057750 A1 * | 3/2017 | Ikenaga | ................. B65G 43/00 |
| 2018/0297620 A1 * | 10/2018 | Murakami | .............. B61B 10/02 |

FOREIGN PATENT DOCUMENTS

| CN | 105636853 A | * | 6/2016 | .......... B61L 15/0081 |
| CN | 108426547 A | * | 8/2018 | ............... B61K 9/12 |
| CN | 109110361 A | * | 1/2019 | ........... B65G 1/0492 |

(Continued)

*Primary Examiner* — Zachary L Kuhfuss
*Assistant Examiner* — Cheng Lin
(74) *Attorney, Agent, or Firm* — The Webb Law Firm

(57) ABSTRACT

An article transport vehicle that travels along a traveling path is provided with an obstacle sensor that detects an obstacle that exists in a detection area, and a control unit that controls the traveling speed of the article transport vehicle based on detection information of the obstacle sensor. A non-detection area where detection of the obstacle by the obstacle sensor is not performed is set within the detectable area of the obstacle sensor, and a situation in which the non-detection area exists on a detection line that joins a part of the detection area and the obstacle sensor is defined as a specific situation. The control unit, in the specific situation, and a situation where an undetectable area in which it is not possible to detect the obstacle exists in the detection area because a shield exists in the non-detection area, reduces the speed of the article transport vehicle to a second traveling speed slower than the first traveling speed.

7 Claims, 11 Drawing Sheets

(56) References Cited

FOREIGN PATENT DOCUMENTS

| | | | | |
|---|---|---|---|---|
| JP | 2011145975 | A | * | 7/2011 |
| JP | 2011145975 | A | | 7/2011 |
| JP | 2017114405 | A | | 6/2017 |
| JP | 2018077037 | A | | 11/2018 |
| JP | 2018177037 | A | | 11/2018 |
| JP | 2018185180 | A | * | 11/2018 |
| JP | 2018185180 | A | | 11/2018 |
| JP | 2019501021 | A | * | 1/2019 |
| JP | 2019109768 | A | | 7/2019 |

* cited by examiner

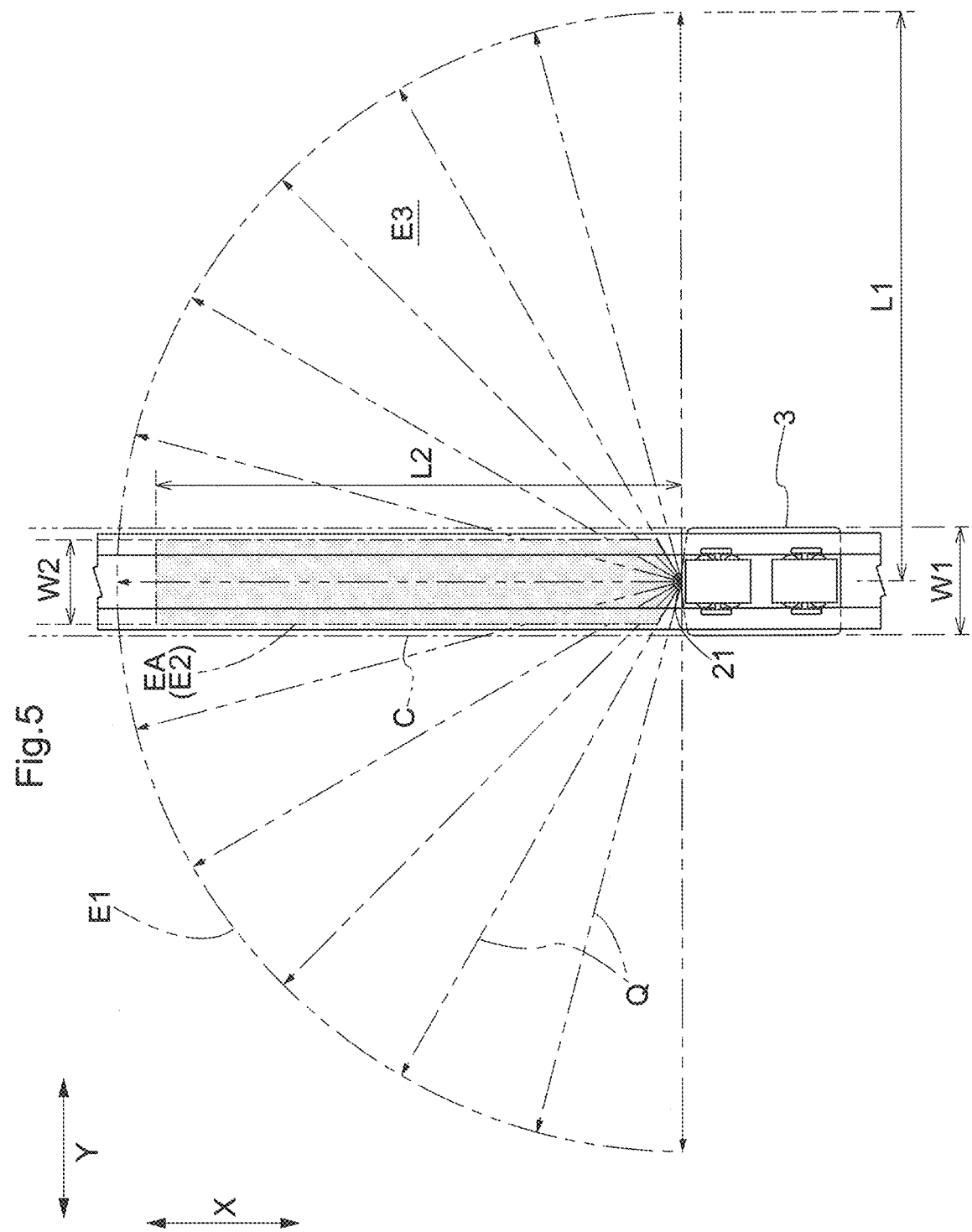

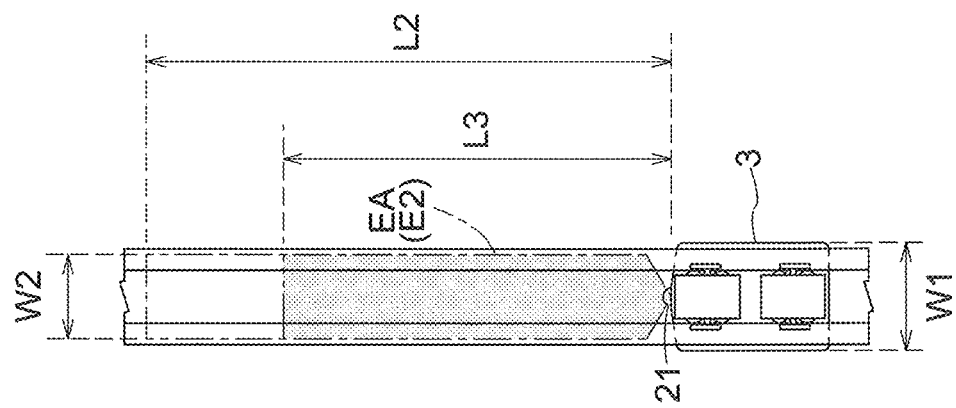
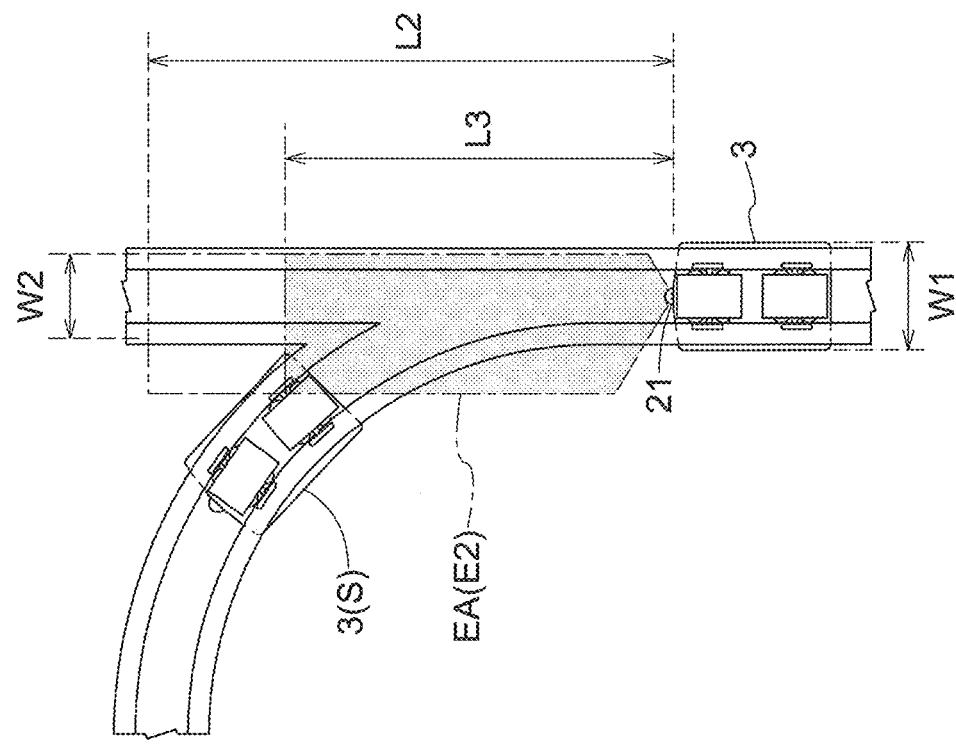

ARTICLE TRANSPORT FACILITY

CROSS-REFERENCE TO RELATED APPLICATION

This application claims priority to Japanese Patent Application No. 2020-003832 filed Jan. 14, 2020, the disclosure of which is hereby incorporated by reference in its entirety.

BACKGROUND OF THE INVENTION

1. Field of the Invention

The present invention relates to an article transport facility provided with an article transport vehicle that travels along a traveling path, thereby transporting an article.

2. Description of the Related Art

As such an article transport facility, for example, the article transport facility described in JP 2018-177037A (Patent Document 1) is known. Hereinafter, in the description of related art, reference signs or names in parentheses are the reference signs or names in the related art document. In the article transport facility described in Patent Document 1, an article transport vehicle (3) is provided with an obstacle sensor (an obstacle detection sensor 21) that detects an obstacle that exists in a detection area (E) set according to the shape of a planned traveling locus on the front side of the article transport vehicle, and a control unit (H) that controls the traveling speed of the article transport vehicle based on detection information of the obstacle sensor. By providing an obstacle sensor in the article transport vehicle in this way, the article transport vehicle, which travels, is able to detect an obstacle that exists in the planned traveling locus.

SUMMARY OF THE INVENTION

In an example configuration of an obstacle sensor, the obstacle sensor has a detectable range in which an obstacle can be detected, and it is possible to set a part of the detectable range as a detection area where an obstacle is actually detected, and to set the remaining range as a non-detection area where an obstacle is not detected. Specifically, in an example configuration of an obstacle sensor, by projecting detection light over the entire detectable range from the obstacle sensor it is possible to detect an obstacle in the detectable range, but a setting can be adopted such that detection of an obstacle is not performed in the non-detection area even if an obstacle exists.

When such an obstacle sensor is provided in the article transport vehicle, since the detection area is curved, it is possible that a shield exists in the non-detection area, which exists on a line that joins a part of the detection area and the obstacle sensor. In such a case, since the detection light projected by the obstacle sensor is blocked by the shield, a situation can occur in which the detection light cannot be caused to reach a part of the detection area, so an undetectable area in which it is not possible to detect an obstacle exists in an area where the obstacle should be detected. In this sort of situation as well, the article transport vehicle should avoid contacting the obstacle, but until now, an article transport vehicle control technique that assumes such a situation has not been known.

Consequently, it is desired to realize an article transport facility such that, even in a situation where an undetectable area in which it is not possible to detect an obstacle exists in an area where the obstacle should be detected, the article transport vehicle can be appropriately controlled such that the article transport vehicle avoids contacting the obstacle.

An article transport facility according to the present disclosure includes an article transport vehicle that travels along a traveling path, thereby transporting an article.

The article transport vehicle is provided with an obstacle sensor that detects an obstacle that exists in a detection area set according to the shape of a planned traveling locus on the front side of the article transport vehicle, and a control unit that controls the traveling speed of the article transport vehicle based on detection information of the obstacle sensor, a non-detection area where detection of the obstacle by the obstacle sensor is not performed is set in an area within the detectable area of the obstacle sensor and outside the planned traveling locus, a situation in which the non-detection area exists on a detection line that joins a part of the detection area and the obstacle sensor because the detection area is curved is defined as a specific situation, and the control unit, in a state where the article transport vehicle is traveling at the first traveling speed, in the specific situation, and a situation where an undetectable area in which it is not possible to detect the obstacle exists in the detection area because a shield exists in the non-detection area, reduces the speed of the article transport vehicle to a second traveling speed slower than the first traveling speed.

According to this configuration, within the detectable area of the obstacle sensor, a detection area set according to the shape of the planned traveling locus on the front side of the article transport vehicle is set, and a non-detection area where detection of the obstacle is not performed is set in an area outside the planned traveling locus. Therefore, the obstacle that exists in the planned traveling locus can be detected by the obstacle sensor, and the article transport vehicle can be caused to travel appropriately according to those detection results.

Here, depending on the shape of the planned traveling locus on the front side of the article transport vehicle, there are situations where the detection area is curved, and due to this, the specific situation in which the non-detection area exists on a detection line that joins a part of the detection area and the obstacle sensor may arise. In this sort of specific situation, when there is a shield in the non-detection area, a situation can arise in which an undetectable area where an obstacle cannot be detected exists in the detection area due to existence of the shield. If an obstacle exists in such an undetectable area, it is possible that the article transport vehicle will contact the obstacle because the obstacle cannot be detected in advance by the obstacle sensor. However, according to the present configuration, in a state where the article transport vehicle is traveling at the first traveling speed, in the specific situation, and a situation where an undetectable area exists in the detection area because a shield exists in the non-detection area, regardless of whether or not an obstacle actually exists in the undetectable area, the traveling speed of the article transport vehicle is reduced from the first traveling speed to the second traveling speed. Therefore, even if an obstacle exists in the undetectable area, it is possible to swiftly stop the article transport vehicle. In other words, the article transport vehicle can be appropriately controlled such that the article transport vehicle avoids contacting the obstacle.

BRIEF DESCRIPTION OF THE DRAWINGS

FIG. 5 shows a detectable area.

FIG. 6 shows a first detection area.

FIG. 7 shows the first detection area when a branching location exists.

DETAILED DESCRIPTION OF PREFERRED EMBODIMENTS

1. Embodiment

An embodiment of an article transport facility will be described with reference to the drawings.

Figure 1:
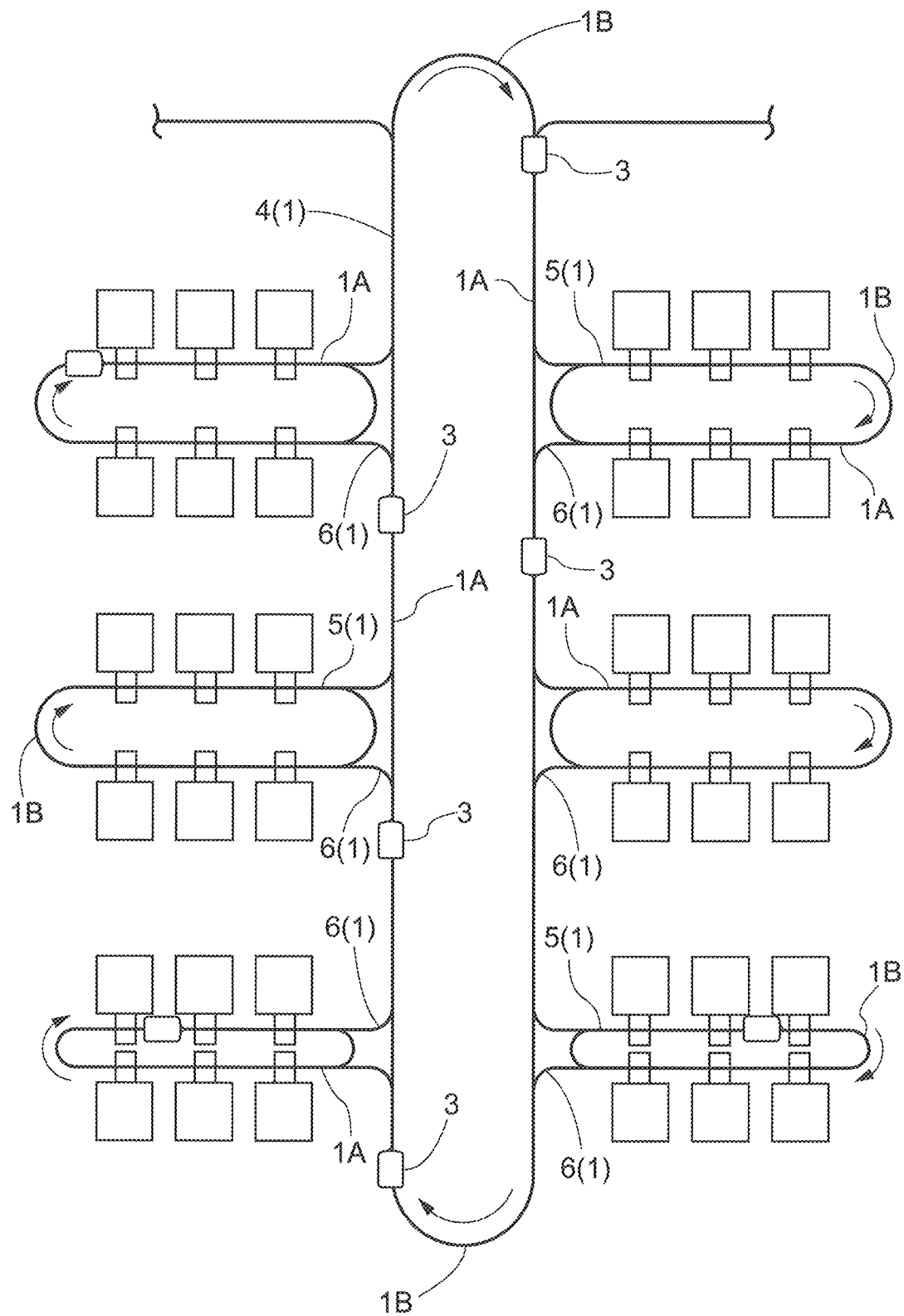
FIG. 1 is a plan view of an article transport facility.
Figure 2:
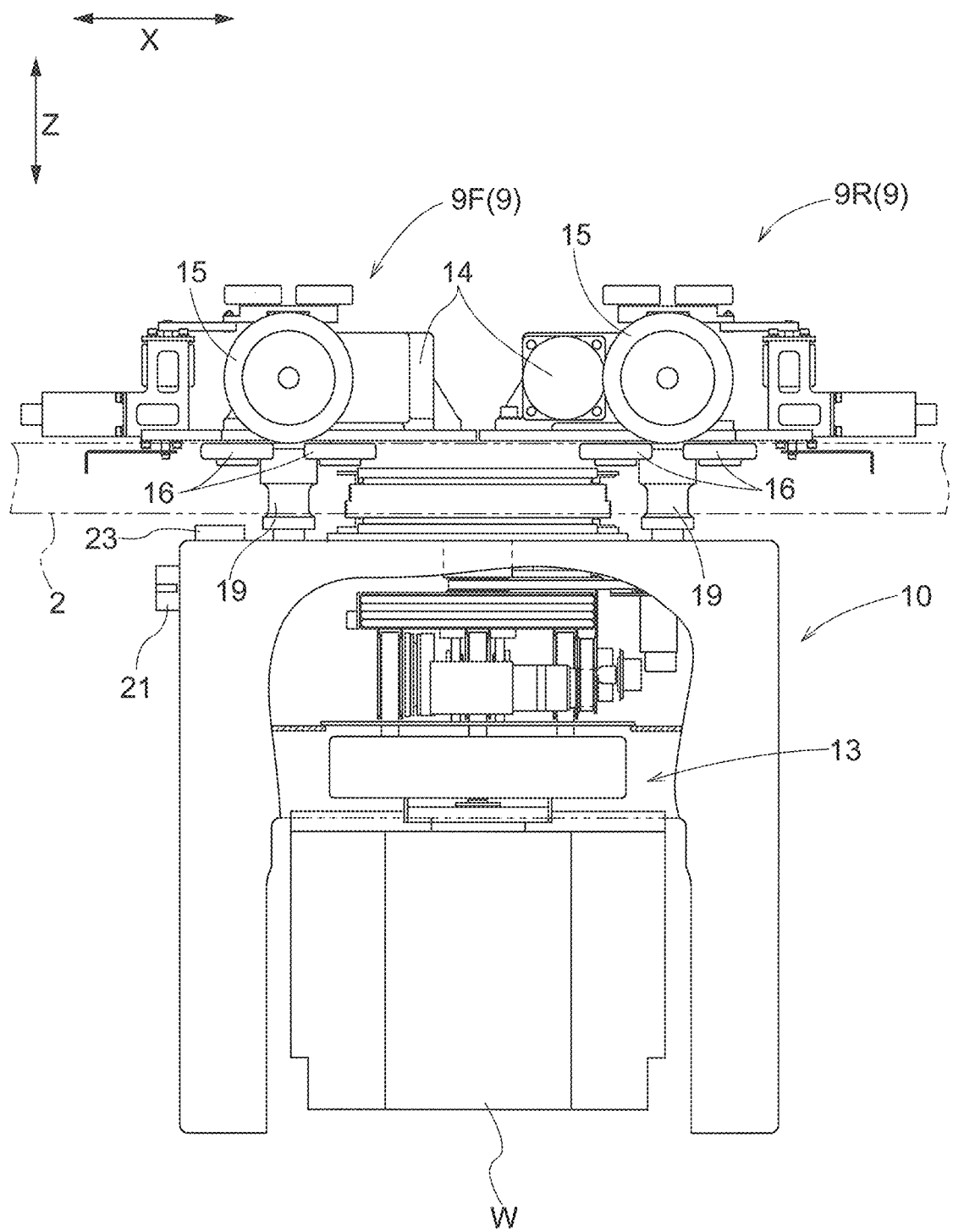
FIG. 2 is a side view of an article transport vehicle.
Figure 3:
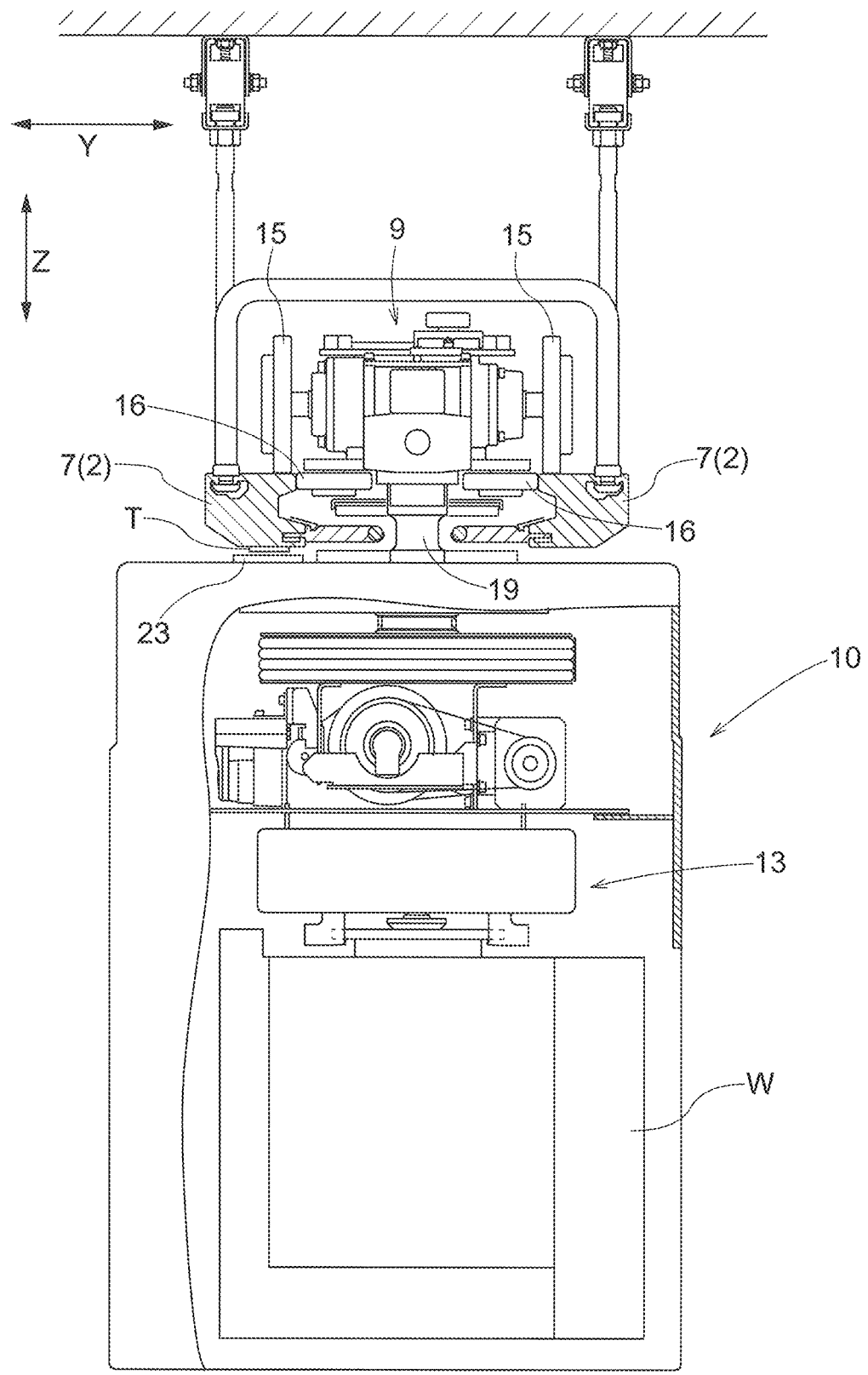
FIG. 3 is a front view of the article transport vehicle.

As shown in FIGS. 1 to 3, the article transport facility is provided with an article transport vehicle 3 that travels along a traveling path 1, thereby transporting an article W. In this embodiment, in addition to the article transport vehicle 3, the article transport facility is provided with a traveling rail 2 installed along the traveling path 1, and the article transport vehicle 3 travels along the traveling path 1 by traveling on the traveling rail 2 while being guided by the traveling rail 2. Note that in this embodiment, the article transport vehicle 3 transports a FOUP (Front Opening Unified Pod) that accommodates semiconductor substrates as the article W.

As shown in FIG. 1, the traveling path 1 includes one annular main path 4, annular sub-paths 5 that pass through a plurality of article processing units, and connecting paths 6 that connect the main path 4 and the sub-paths 5. The traveling path 1 includes a plurality of the sub-paths 5. The article transport vehicle 3 travels in the same circumferential direction (clockwise in the present embodiment) in both the main path 4 and the plurality of sub-paths 5. In FIG. 1, the traveling direction of the article transport vehicle 3 is indicated by arrows. The connecting paths 6 include connecting paths 6 for branching, which allow branching travel of the article transport vehicle 3 from the main path 4 toward sub-paths 5, and connecting paths 6 for merging, which allow merging travel of the article transport vehicle 3 from the sub-paths 5 toward the main path 4.

The traveling path 1 includes linear portions 1A set in a linear shape and curved portions 1B set in a curved shape. Specifically, the main path 4 is formed with a parallel pair of the linear portions 1A and a pair of the curved portions 1B that connect the ends of the pair of linear portions 1A to each other. Each of the plurality of sub-paths 5, similarly to the main path 4, is formed by a pair of the linear portions 1A and a pair of the curved portions 1B. The connecting paths 6 are formed with a curved portion 1B configured to connect to the main path 4 and a linear portion 1A configured to connect to the sub-path 5. As described above, the traveling path 1 is set by combining the linear portions 1A and the curved portions 1B.

Next, the article transport vehicle 3 will be described. Note that in the following description, the direction along the traveling path 1 will be referred to as a path longitudinal direction X, and in a vertical direction view along a vertical direction Z, the direction orthogonal to the path longitudinal direction X will be referred to as a path width direction Y. Further, in the traveling path 1, the traveling direction of the article transport vehicle 3 (the direction in which the article transport vehicle 3 travels) will be referred to as the front side. Incidentally, for example, when the article transport vehicle 3 is traveling through a linear portion of the traveling path 1, the front-rear direction of the article transport vehicle 3 and the path longitudinal direction X of the traveling path 1 are in the same direction, and the left-right direction of the article transport vehicle 3 and the path width direction Y of the traveling path 1 are in the same direction.

In the present embodiment, as shown in FIGS. 2 and 3, the article transport vehicle 3 includes a traveling portion 9 that travels on and along the traveling rail 2, which is suspended from and supported by the ceiling, and a main body portion 10 that is located below the traveling rail 2 and is suspended from and supported by the traveling portion 9. The main body 10 includes a support mechanism 13 that is provided so as to be capable of raising/lowering in the main body 10, and supports the article W in a suspended state.

The traveling portion 9 includes a first traveling mechanism 9F and a second traveling mechanism 9R arranged in the front-rear direction of the article transport vehicle 3. The first traveling mechanism 9F includes an electric traveling motor 14 and a left-right pair of traveling wheels 15 that are rotationally driven by the traveling motor 14. The left-right pair of traveling wheels 15 are configured to roll on an upper face of the traveling rail 2 (a left-right pair of rail portions 7). Also, the first traveling mechanism 9F includes a left-right pair of guide wheels 16 that are rotatable around a vertical axis center (around an up-down axis center) along the vertical direction Z. The left-right pair of guide wheels 16 are located between the left-right pair of rail portions 7 and are configured to roll on side faces of the left-right pair of rail portions 7 facing each other. Note that two left-right pairs of the guide wheels 16 are provided in the first traveling mechanism 9F in a state lined up in the front-rear direction. Similar to the first traveling mechanism 9F, the second traveling mechanism 9R includes one left-right pair of the traveling wheels 15 and two left-right pairs of the guide wheels 16.

The first traveling mechanism 9F and the second traveling mechanism 9R include connecting shafts 19 that protrude downward from the lower end of the traveling wheels 15. The connecting shaft 19 of the first traveling mechanism 9F and the main body portion 10 are connected so as to be rotatable relative to each other around the center of the vertical axis along the vertical direction Z. Also, the connecting shaft 19 of the second traveling mechanism 9R and the main body portion 10 are connected so as to be rotatable relative to each other around the center of the vertical axis along the vertical direction Z.

The article transport vehicle 3 travels along the traveling path 1 due to the traveling wheels 15 of the first traveling mechanism 9F and the second traveling mechanism 9R being rotationally driven by the traveling motor 14, while the position of the article transport vehicle 3 in the path width direction Y is restricted due to the guide wheels 16 of the first traveling mechanism 9F and the second traveling mechanism 9R being guided by the pair of traveling rails 2. Also, the article transport vehicle 3 is configured to be capable of traveling along the traveling path 1 even through the curved portions 1B, due to the first traveling mechanism 9F and the second traveling mechanism 9R swinging around the vertical axis center with respect to the main body portion 10.

Figure 4:
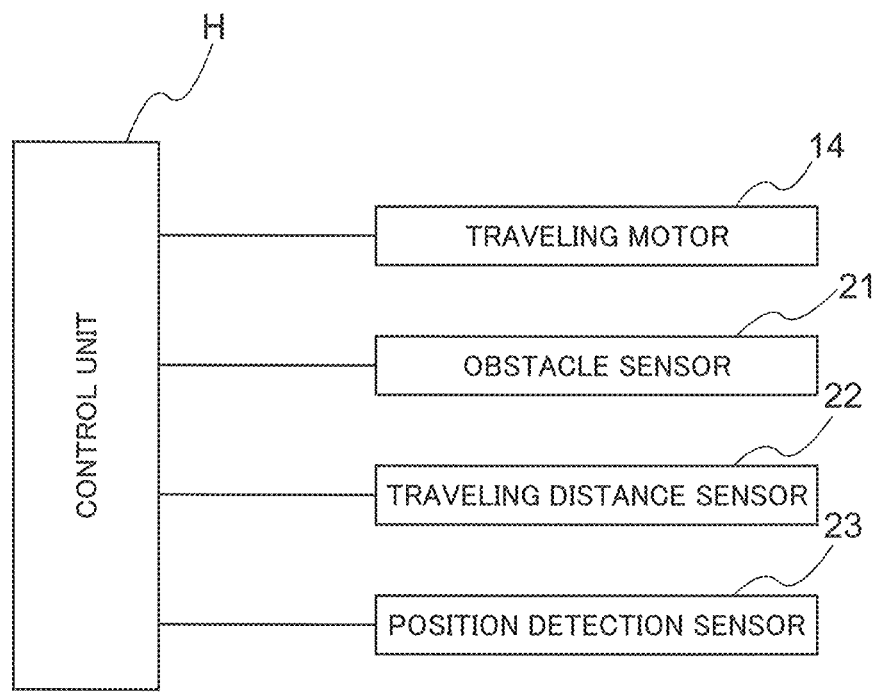
FIG. 4 is a control block diagram.

As shown in FIG. 4, the article transport vehicle 3 includes an obstacle sensor 21, a traveling distance sensor 22, a position detection sensor 23, and a control unit H. As shown in FIGS. 5 to 16, the obstacle sensor 21 detects an obstacle S that exists in a detection area E2 that has been set according to the shape of a planned traveling locus C on the front side of the article transport vehicle 3. In the present embodiment, the obstacle sensor 21 is configured by using a distance sensor that uses light such as a laser, for example. The obstacle sensor 21 defines another article transport vehicle 3 that exists on the front side of the article transport vehicle 3 in which that obstacle sensor 21 is provided, or a person, an object, or the like that has invaded into the traveling locus of the article transport vehicle 3 as the obstacle S. The traveling distance sensor 22 is configured with a rotary encoder or the like, and measures the traveling distance of the article transport vehicle 3 from a reference position that has been set on the traveling path 1. The position detection sensor 23 detects a plurality of detected bodies T (see FIG. 3) installed along the traveling path 1 and acquires position information.

The traveling path 1 is a virtual path where the article transport vehicle 3 should travel. The traveling path 1 is prescribed by the shape of the traveling rail 2. The control unit H stores traveling map information. The traveling map information is information in which basic map information that is information regarding the shape of the traveling path 1 and connection relationships is associated with position information indicating a specific position, such as a location where a detected body T has been installed, a prescribed stopping position V which has been set at a transfer position of the article W or the like, in the traveling path 1. The control unit H discriminates the position of the article transport vehicle 3 in the traveling path 1 based on the detection information of the traveling distance sensor 22, the detection information of the position detection sensor 23, and the traveling map information. Then, when a transport command is commanded from a host controller, the control unit H sets a path for transporting the article W from a transport source designated by the transport command to a transport destination based on the traveling map information, and controls the article transport vehicle 3 so as to travel along the set path and transport the article W from the transport source to the transport destination.

Further, the control unit H stores traveling speed information, which is information indicating the traveling speed of the article transport vehicle 3, in a state associated with the traveling map information. In the present embodiment, a reference traveling speed is set according to the shape of the traveling path 1, and the reference traveling speed when the article transport vehicle 3 travels through a curved portion 1B is set lower than the reference traveling speed when the article transport vehicle 3 travels through a linear portion 1A. Specifically, a linear traveling speed is set as the reference traveling speed when the article transport vehicle 3 travels through a linear portion 1A, and a curve traveling speed that is slower than the linear traveling speed is set as the reference traveling speed when the article transport vehicle 3 travels through a curved portion 1B. The linear traveling speed and the curve traveling speed that have been set as the reference traveling speed in this way correspond to a first traveling speed.

When the article transport vehicle 3 travels from a linear portion 1A toward a curved portion 1B, the control unit H changes the reference traveling speed from the linear traveling speed to the curve traveling speed before the article transport vehicle 3 enters the curved portion 1B. As a result, the traveling speed of the article transport vehicle 3 is reduced from the linear traveling speed to the curve traveling speed. Therefore, the article transport vehicle 3 enters the curved portion 1B at the curve traveling speed, and travels through the curved portion 1B at the curve traveling speed. Also, when the article transport vehicle 3 travels from a curved portion 1B toward a linear portion 1A, the control unit H changes the reference traveling speed from the curve traveling speed to the linear traveling speed after the article transport vehicle 3 enters the linear portion 1A. As a result, the traveling speed of the article transport vehicle 3 is increased from the curve traveling speed to the linear traveling speed in the linear portion 1A. Therefore, the article transport vehicle 3 travels through the linear portion 1A at the linear traveling speed.

As shown in FIG. 5, the obstacle sensor 21 is configured to be able to detect an obstacle S that exists in a detectable area E1, and to be able to measure the distance to that obstacle S. In the present embodiment, the obstacle sensor 21 is configured to be able to detect the obstacle S within the detectable area E1, which has a fan shape centered on the obstacle sensor 21 when viewed in the vertical direction, by rotating a projection portion that projects an obstacle detection laser around the center of the vertical axis. Further, in the present embodiment, the obstacle sensor 21 is mounted on the front end portion of the article transport vehicle 3, and projects the obstacle detection laser along a detection line Q from the front side over a span to both lateral sides (both sides in the left-right direction), thus forming the semicircular, flat detectable area E1 having a radius L1 on the front side of the article transport vehicle 3. Also, the obstacle sensor 21 is configured such that a setting of the shape of the detection area E2 set in the detectable area E1 can be changed based on a command from the control unit H.

Figure 8:
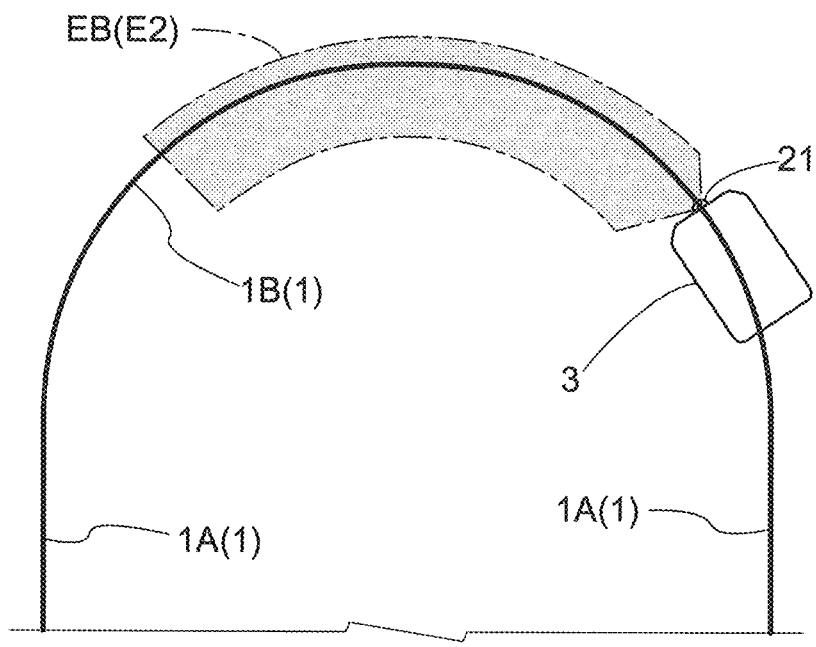
FIG. 8 shows a second detection area.
Figure 9:
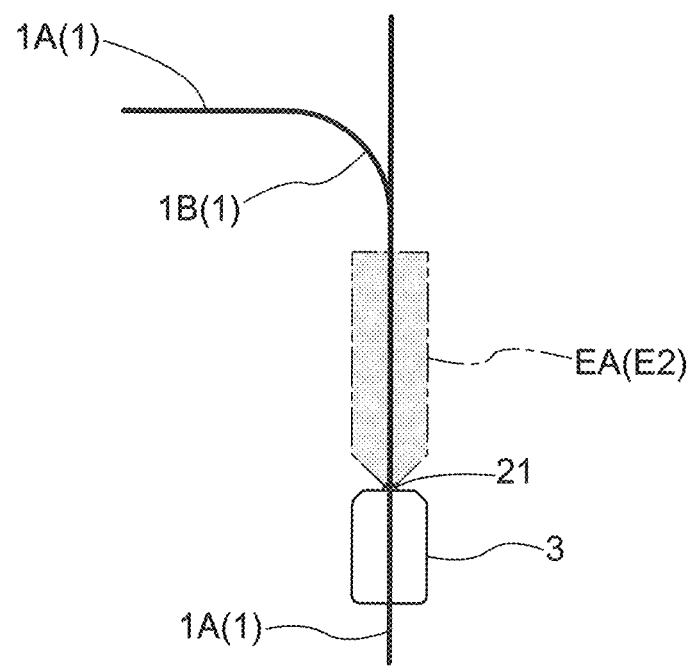
FIG. 9 shows changes in the detection area.
Figure 10:
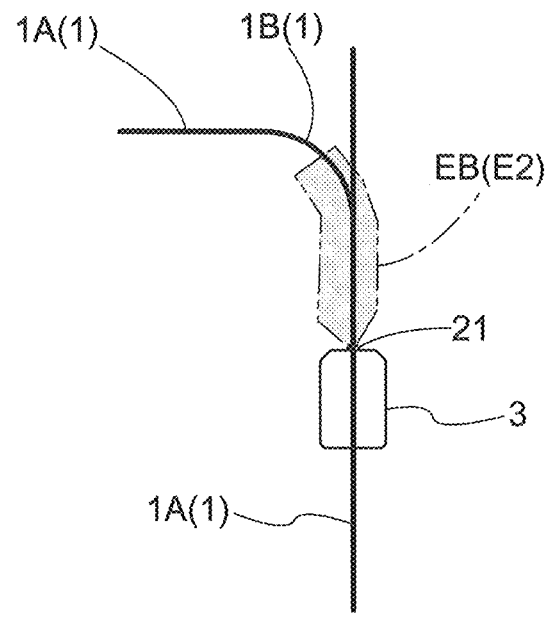
FIG. 10 shows changes in the detection area.
Figure 11:
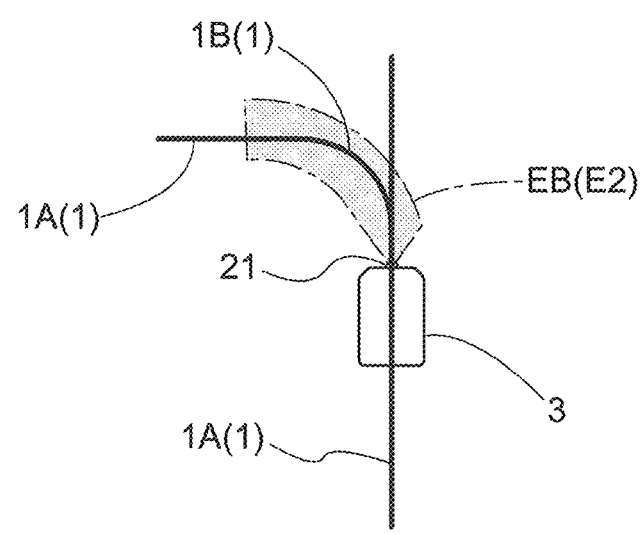
FIG. 11 shows changes in the detection area.
Figure 12:
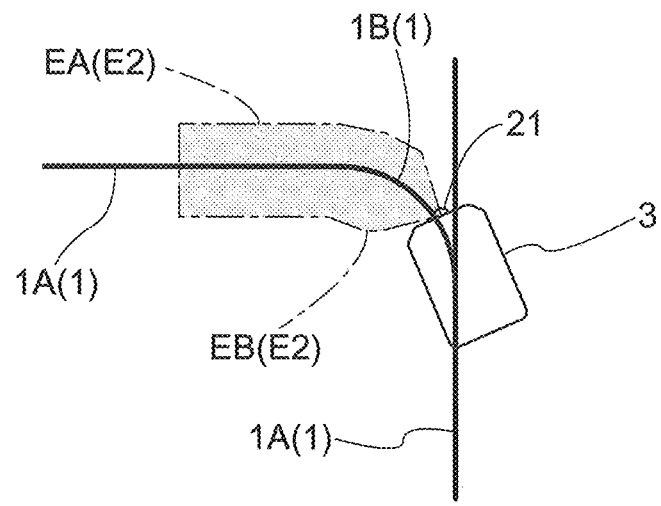
FIG. 12 shows changes in the detection area.
Figure 13:
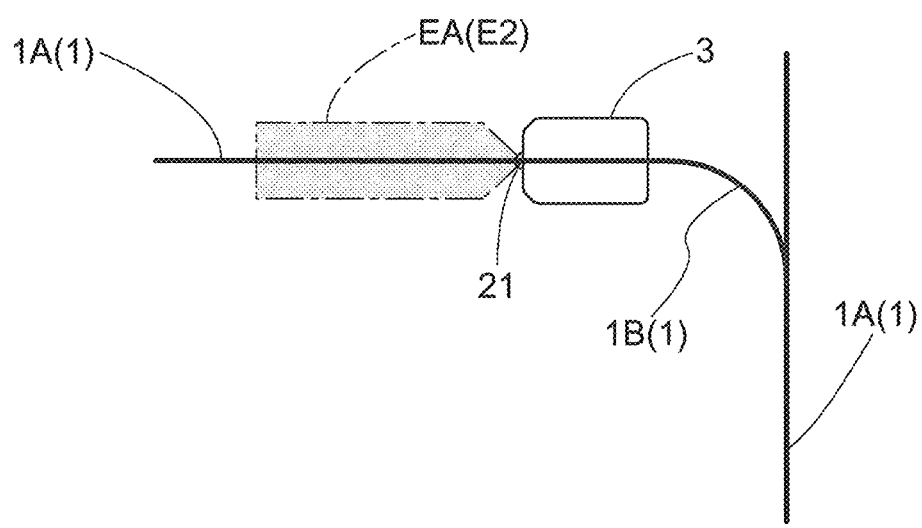
FIG. 13 shows changes in the detection area.
Figure 14:
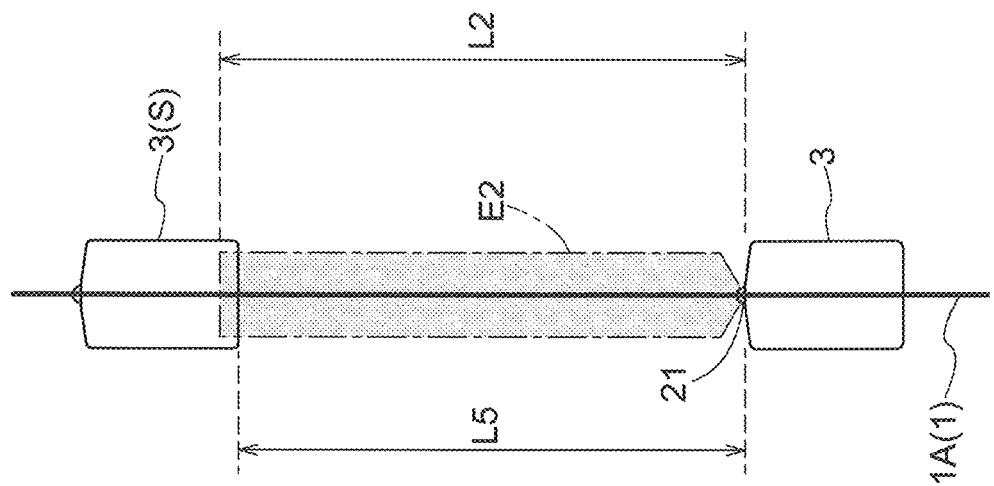
FIG. 14 shows an obstacle detection distance.

As shown in FIG. 5, the obstacle sensor 21 sets the detection area E2 in the detectable area E1. In the present embodiment, as shown in FIGS. 5 to 7, the obstacle sensor 21 is configured to set a linear first detection area EA to be set when traveling through a linear portion 1A, and as shown in FIG. 8, the obstacle sensor 21 is configured to set a curved second detection area EB to be set when traveling through a curved portion 1B. Further, in the present embodiment, the lengths of the first detection area EA and the second detection area EB are changed according to the traveling speed of the article transport vehicle 3. That is, the article transport vehicle 3 shown in FIG. 5 is traveling at a higher speed than the article transport vehicle 3 shown in FIG. 6, and the length L2 of the first detection area EA shown in FIG. 5 is longer than the length L3 of the first detection area EA shown in FIG. 6. Note that FIG. 5 shows the first detection area EA when the article transport vehicle 3 is traveling at the linear traveling speed. Thus, the first detection area EA is set to a longer area as the traveling speed of the article transport vehicle 3 increases. Further, the second detection area EB is set in a shape corresponding to the radius of curvature or the like of the curved portion 1B, and similarly to the first detection area EA, the second detection area EB is set to a longer area as the traveling speed of the article transport vehicle 3 increases. Also, the control unit H sets the detection area E2 such that the length of the detection area E2 along the traveling path 1 increases as the traveling speed of the article transport vehicle 3 increases.

In the present embodiment, the first detection area EA and the second detection area EB are formed in a strip shape when viewed in the vertical direction along the vertical direction Z. The first detection area EA includes, as shown in FIGS. 5, 6 and 8, a first detection area EA with a narrow width, in which a width W2 in the path width direction Y is set to a width narrower than a width W1 in the path width direction Y of the article transport vehicle 3, and as shown in FIG. 7, a first detection area EA with a wide width that is set so as to protrude to one side in the path width direction Y with respect to the article transport vehicle 3. When the first detection area EA is positioned at a location where the traveling path 1 branches or merges, by adopting the first detection area EA with a wide width, in addition to the path where the article transport vehicle 3 travels, it is also possible to detect another article transport vehicle 3 that exists in a path that branches or merges.

As shown in FIGS. 9 to 13, when the article transport vehicle 3 travels from a linear portion 1A toward a curved portion 1B, the obstacle sensor 21 sets an area in which the first detection area EA and the second detection area EB coexist, such that the detection area E2 has a shape corresponding to the traveling path 1. That is, the shape of the detection area E2 is set so as to change from the linear first detection area EA to the curved second detection area EB in order from the front side of the detection area E2. Further, also in a case where the article transport vehicle 3 travels from a curved portion 1B toward a linear portion 1A, the obstacle sensor 21 sets an area in which the first detection area EA and the second detection area EB coexist, such that the detection area E2 has a shape corresponding to the traveling path 1. That is, the shape of the detection area E2 is set so as to change from the curved second detection area EB to the linear first detection area EA in order from the front side of the detection area E2.

The control unit H discriminates the position of the article transport vehicle 3 in the traveling path 1 based on the detection information of the traveling distance sensor 22, the detection information of the position detection sensor 23, and the traveling map information, and also discriminates the shape of the traveling path 1 on the front side of the article transport vehicle 3. Then, the control unit H sets the detection area E2 by changing the shape of the detection area E2 as needed according to the shape of the traveling path 1 on the front side of the article transport vehicle 3. As a result, the detection area E2 is set to a shape that matches the shape of the traveling path 1 on the front side of the article transport vehicle 3 (the shape of the planned traveling locus C).

Further, as shown in FIG. 5, a non-detection area E3, where detection of the obstacle S by the obstacle sensor 21 is not performed, is set in an area within the detectable area E1 of the obstacle sensor 21 and outside of the planned traveling locus C. In the present embodiment, an area within the detectable area E1 and outside of the detection area E2 (the first detection area EA and the second detection area EB) is set as the non-detection area E3. The obstacle sensor 21 does not detect the obstacle S in the non-detection area E3 even if that obstacle S exists, and detects the obstacle S in the detection area E2 when that obstacle S exists.

When the obstacle S is not detected in the detection area E2, the control unit H causes the article transport vehicle 3 to travel at the reference traveling speed (the linear traveling speed or the curve traveling speed), and when the obstacle S is detected in the detection area E2, the control unit H causes the article transport vehicle 3 to decelerate to an emergency traveling speed slower than the reference traveling speed. Then, using the distance along the traveling path 1 from the article transport vehicle 3 to the obstacle S detected in the detection area E2 as the obstacle detection distance L5 (see FIG. 14), the control unit H sets that emergency traveling speed such that the emergency traveling speed decreases as the obstacle detection distance L5 becomes shorter.

Figure 17:
FIG. 17 shows speed changes of the article transport vehicle that accompany detection of an obstacle.

In the present embodiment, as shown in FIG. 17, a plurality of speeds are set as emergency traveling speeds. All of the plurality of emergency traveling speeds are set slower than the linear traveling speed. Further, some of the plurality of emergency traveling speeds are set slower than the curve traveling speed. In the present embodiment, six emergency traveling speeds (a first emergency traveling speed R1 to a sixth emergency traveling speed R6) are set as the plurality of emergency traveling speeds. All six emergency traveling speeds are set slower than the linear traveling speed. Further, the third emergency traveling speed R3, which is one of the six emergency traveling speeds, is set to the same speed as the curve traveling speed, and the fourth emergency traveling speed R4 to the sixth emergency traveling speed R6 are set slower than the curve traveling speed. In the present embodiment, regarding both linear travel and curve travel, an emergency traveling speed slower than the reference traveling speed (the first traveling speed) corresponds to a third traveling speed. Also note that in the present embodiment, the sixth emergency traveling speed R6 is set to zero (stop).

The control unit H sets the emergency traveling speed such that the emergency traveling speed decreases as the obstacle detection distance L5 becomes shorter. For example, in a case where the article transport vehicle 3 is traveling at the linear traveling speed, when the obstacle S is detected by the obstacle sensor 21, as the obstacle detection distance L5 becomes shorter, the setting of the traveling speed of the article transport vehicle 3 is changed in order from the linear traveling speed to the first emergency traveling speed R1, to the second emergency traveling speed R2, to the third emergency traveling speed R3, to the fourth emergency traveling speed R4, to the fifth emergency traveling speed R5, to the sixth emergency traveling speed R6. As a result, the traveling speed of the article transport vehicle 3 gradually decreases, and stops when reaching the sixth emergency traveling speed R6. Further, for example, in a case where the article transport vehicle 3 is traveling at the curve traveling speed, when the obstacle S is detected by the obstacle sensor 21, as the obstacle detection distance L5 becomes shorter, the setting of the traveling speed of the article transport vehicle 3 is changed in order from the curve traveling speed to the fourth emergency traveling speed R4, to the fifth emergency traveling speed R5, to the sixth emergency traveling speed R6. As a result, the traveling speed of the article transport vehicle 3 continually decreases, and stops when reaching the sixth emergency traveling speed R6. In this way, the control unit H decelerates the article transport vehicle 3 when the obstacle S in the detection area E2 is detected by the obstacle sensor 21 based on the detection information of the obstacle sensor 21.

Figure 15:
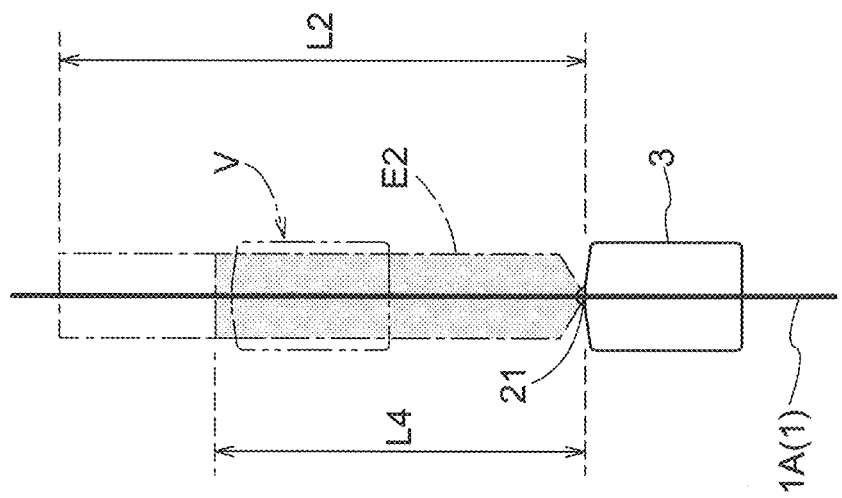
FIG. 15 shows the detection area when the article transport vehicle stops at a stopping position.

Further, in the present embodiment, as shown in FIG. 15, when the article transport vehicle 3 is stopped at the prescribed stopping position V, the control unit H sets the length of the detection area E2 along the traveling path 1 to a length L4 from the obstacle sensor 21 to the stopping position V. That is, the control unit H changes the length of the detection area E2 in the path longitudinal direction X according to the distance to the stopping position V. In the present embodiment, the length L4 of the detection area E2 is a length shorter than the length L1 of the detection area E2 when the article transport vehicle 3 travels at the linear traveling speed, and is a length to the front end portion of the article transport vehicle 3 when assumed that the article transport vehicle 3 is stopped at the stopping position V, or a length to the front side a set distance away from the front end portion of the article transport vehicle 3. Here, the stopping position V is set to, for example, an article W transfer position. The article W transfer position is the position of the article transport vehicle 3 when the article transport vehicle 3 transfers the article W to/from the location of the transport source or the transport destination of the article W. For example, the stopping position V is a position corresponding to a delivery portion that performs delivery to a processing device that performs processing for the article W, or a position corresponding to a delivery portion that performs delivery to a storage facility that stores the article W.

Incidentally, in a case where, for example, the article transport vehicle 3 travels through a curved portion 1B, when the shape of the planned traveling locus on the front side is curved, as described above, the curved second detection area EB is set. In such a case, because the detection area E2 is curved, a situation may arise in which the non-detection area E3 exists on the detection line Q that joins a part of the detection area E2 and the obstacle sensor 21. Consequently, with this sort of situation defined as a specific situation, in a state where the article transport vehicle 3 is traveling at the first traveling speed, in that specific situation, and a situation where an undetectable area E4 in which it is not possible to detect the obstacle S that exists in the detection area E2 because a shield U exists in the non-detection area E3, the control unit H reduces the speed of the article transport vehicle 3 to a second traveling speed slower than the first traveling speed.

Figure 16:
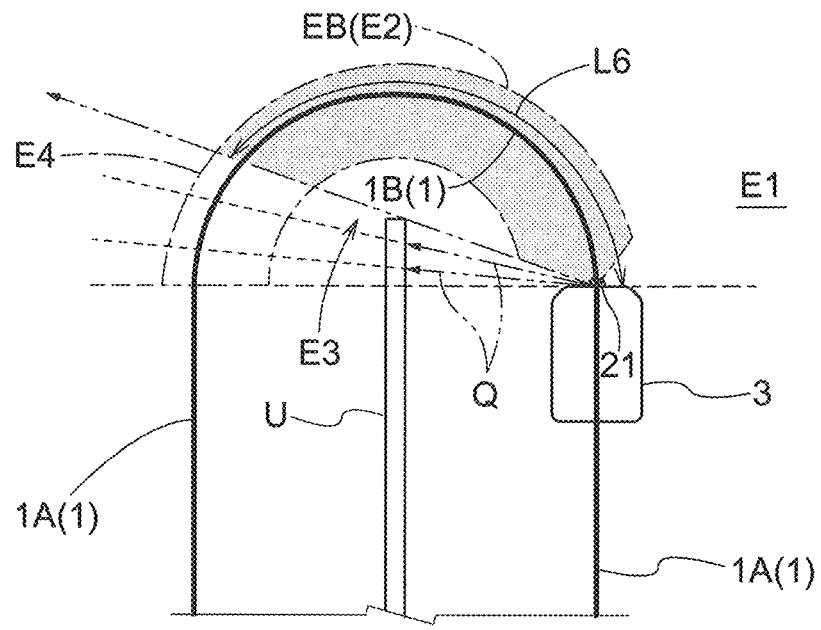
FIG. 16 shows a detection area in which an undetectable area exists.

For example, as shown in FIG. 16, when the article transport vehicle 3 travels through a curved portion 1B, a part or all of the detection area E2 becomes a curved second detection area EB. That is, a part or all of the detection area E2 is curved. In such a case, the specific situation arises in which the non-detection area E3 exists on the detection line Q that joins a part of the detection area E2 and the obstacle sensor 21. Further, in such a non-detection area E3, for example, a shield U such as a partition may be installed between a pair of the linear portions 1A. When the article transport vehicle 3 travels in the vicinity of the curved portion 1B, if such a shield U exists in the non-detection area E3, the obstacle detection laser projected by the obstacle sensor 21 is blocked by the shield U, so there may be cases where the laser cannot reach a partial area including the front end portion of the detection area E2, and an obstacle S in that area cannot be detected. In this case, the area where the obstacle S cannot be detected is the undetectable area E4.

Thus, in the above-mentioned specific situation, and a situation where the undetectable area E4 in which it is not possible to detect the obstacle S exists in the detection area E2 because the shield U exists in the non-detection area E3, the control unit H reduces the speed of the article transport vehicle 3 to an emergency traveling speed (the second traveling speed) slower than the reference traveling speed (the first traveling speed). Further, in the present embodiment, using the distance along the traveling path 1 from the article transport vehicle 3 to the undetectable area E4 as an undetectable distance L6, the control unit H sets the emergency traveling speed (the second traveling speed) such that the emergency traveling speed decreases as the undetectable distance L6 becomes shorter. Note that in the present embodiment, the emergency traveling speed slower than the reference traveling speed (the first traveling speed) corresponds to the second traveling speed. That is, when a situation arises in which the undetectable area E4 exists in a state where the reference traveling speed is the linear traveling speed, each of the first emergency traveling speed R1 to the sixth emergency traveling speed R6 corresponds to the second traveling speed. Further, when a situation arises in which the undetectable area E4 exists in a state where the reference traveling speed is the curve traveling speed, each of the fourth emergency traveling speed R4 to the sixth emergency traveling speed R6 corresponds to the second traveling speed. Note that in the present embodiment, the second traveling speed is not particularly distinguished from the third traveling speed that decelerates when an obstacle S is detected in the detection area E2, and the same speed setting is used.

That is, the control unit H sets the emergency traveling speed such that the emergency traveling speed decreases as the undetectable distance L6 becomes shorter. For example, in a case where the article transport vehicle 3 travels at the curve traveling speed, when a situation arises in which the undetectable area E4 exists in the detection area E2, as the undetectable distance L6 becomes shorter, the setting of the traveling speed of the article transport vehicle 3 is changed in order from the curve traveling speed to the fourth emergency traveling speed R4, to the fifth emergency traveling speed R5, to the sixth emergency traveling speed R6. As a result, the traveling speed of the article transport vehicle 3 gradually decreases. Here, in a case where an obstacle S exists in the undetectable area E4, the obstacle S is detected by the obstacle sensor 21 due to the article transport vehicle 3 advancing. In this case, the control unit H, based on the detection information of the obstacle sensor 21, executes control for a case where an obstacle S is detected as described above, thereby reducing the speed of the article transport vehicle 3. On the other hand, in a case where an obstacle S does not exist in the undetectable area E4, the undetectable area E4 decreases due to the article transport vehicle 3 advancing, so the article transport vehicle 3 does not reach the sixth emergency traveling speed R6 and stop, but rather, travel of the article transport vehicle 3 continues. Then, when the article transport vehicle 3 advances and the undetectable area E4 no longer exists, the traveling speed of the article transport vehicle 3 is again set to the curve traveling speed, and thus the article transport vehicle 3 accelerates.

2. Other Embodiments

Following is a description of other embodiments of an article transport facility.

(1) In the above embodiment, exemplary configurations were described in which the detectable area E1 is an area with a fan shape when viewed in the vertical direction as shown in FIG. 5, or an area with a semicircular shape. However, the invention is not limited to such configurations. For example, the detectable area E1 may be an area with a shape other than a fan shape, such as a rectangular shape or a triangular shape when viewed in the vertical direction. Also, in the above embodiment, an exemplary configuration was described in which the detectable area E1 is a flat area obtained by rotating a projection portion around the center of the vertical axis. However, the invention is not limited to such a configuration, and for example, the detectable area E1 may be defined as a three-dimensional area by rotating the projection portion around the center of the horizontal axis in addition to rotating the projection portion around the center of the vertical axis.

(2) In the above embodiment, an exemplary configuration was described in which the detection area E2 is an area with a strip shape when viewed in the vertical direction. However, the invention is not limited to such a configuration. For example, the detection area E2 may have a shape other than a strip shape, such as a semicircular shape or a triangular shape when viewed in the vertical direction.

(3) In the above embodiment, an exemplary configuration was described in which the emergency traveling speed (the third traveling speed) is set such that the emergency traveling speed decreases as the obstacle detection distance L5 becomes shorter. However, the invention is not limited to such a configuration. For example, the emergency traveling speed (the third traveling speed) when an obstacle S is detected may be only one speed slower than the reference traveling speed (the first traveling speed). Also, the emergency traveling speed (the third traveling speed) in this case may have two settings, namely one speed when reducing the speed from the linear traveling speed, and one speed when reducing the speed from the curve traveling speed. Also, this emergency traveling speed (the third traveling speed) may be zero. In this case, the control unit H immediately stops the article transport vehicle 3 when the obstacle S is detected by the obstacle sensor 21.

(4) In the above embodiment, an exemplary configuration was described in which the emergency traveling speed (the second traveling speed) is set such that the emergency traveling speed decreases as the undetectable distance L6 becomes shorter. However, the invention is not limited to such a configuration. For example, the emergency traveling speed (the second traveling speed) when the undetectable area E4 exists may be only one speed slower than the reference traveling speed (the first traveling speed). Also, the emergency traveling speed (the second traveling speed) in this case may have two settings, namely one speed when reducing the speed from the linear traveling speed, and one speed when reducing the speed from the curve traveling speed. Also, this emergency traveling speed (the second traveling speed) may be zero. In this case, the control unit H immediately stops the article transport vehicle 3 when a situation arises in which the undetectable area E4 exists.

(5) In the above embodiment, an exemplary configuration was described in which the second traveling speed, which is the emergency traveling speed when the undetectable area E4 exists, and the third traveling speed, which is the emergency traveling speed when the obstacle S is detected, are set to the same speed. However, the invention is not limited to such a configuration, and the second traveling speed and the third traveling speed may be set differently. For example, even when the undetectable area E4 exists, an obstacle S does not always actually exist in the undetectable area E4, so it is suitable to set the second traveling speed higher than the third traveling speed used in a case where an obstacle S is actually detected.

(6) In the above embodiment, an exemplary configuration was described in which the control unit H sets the detection area E2 such that the length of the detection area E2 increases as the traveling speed of the article transport vehicle 3 increases. However, the invention is not limited to such a configuration. For example, a configuration may also be adopted in which the control unit H sets the length of the detection area E2 to a constant length regardless of the traveling speed of the article transport vehicle 3.

(7) In the above embodiment, an exemplary configuration was described in which when stopping the article transport vehicle 3 at the default stopping position V, the length of the detection area E2 is set to the length from the obstacle sensor 21 to the stopping position V. However, the invention is not limited to such a configuration. For example, a configuration may be adopted in which the length of the detection area E2 is set to the same length when stopping the article transport vehicle 3 at the predetermined stopping position V as when not stopping the article transport vehicle 3 at the predetermined stopping position V.

(8) In the above embodiment, an exemplary configuration was described in which the article transport vehicle 3 travels along the traveling rail 2 suspended from and supported by the ceiling. However, the invention is not limited to such a configuration. For example, a configuration may be adopted in which the article transport vehicle 3 travels along a traveling rail 2 that is installed on the floor surface. Also, the article transport vehicle 3 may be a trackless vehicle that travels on the floor surface. In the case of a trackless article transport vehicle 3, the position of the traveling path 1 may be fixed, or the position of the traveling path 1 may be changed each time.

(9) It should be noted that the configurations disclosed in each of the above embodiments can be applied in combination with the configurations disclosed in other embodiments as long as no contradiction arises. Regarding those other configurations as well, the embodiments disclosed in the present specification are merely examples in all respects. Accordingly, various modifications can be made as appropriate in a range that does not depart from the gist of the present disclosure.

3. Summary of the Above Embodiments

Following is a summary of the article transport facility described above.

An article transport facility includes an article transport vehicle that travels along a traveling path, thereby transporting an article.

The article transport vehicle is provided with an obstacle sensor that detects an obstacle that exists in a detection area set according to the shape of a planned traveling locus on the front side of the article transport vehicle, and a control unit that controls the traveling speed of the article transport vehicle based on detection information of the obstacle sensor, a non-detection area where detection of the obstacle by the obstacle sensor is not performed is set in an area within the detectable area of the obstacle sensor and outside the planned traveling locus, a situation in which the non-detection area exists on a detection line that joins a part of the detection area and the obstacle sensor because the detection area is curved is defined as a specific situation, and the control unit, in a state where the article transport vehicle is traveling at the first traveling speed, in the specific situation, and a situation where an undetectable area in which it is not possible to detect the obstacle exists in the detection area because a shield exists in the non-detection area, reduces the speed of the article transport vehicle to a second traveling speed slower than the first traveling speed.

According to this configuration, within the detectable area of the obstacle sensor, a detection area set according to the shape of the planned traveling locus on the front side of the article transport vehicle is set, and a non-detection area where detection of the obstacle is not performed is set in an area outside the planned traveling locus. Therefore, the obstacle that exists in the planned traveling locus can be detected by the obstacle sensor, and the article transport vehicle can be caused to travel appropriately according to those detection results.

Here, depending on the shape of the planned traveling locus on the front side of the article transport vehicle, there are situations where the detection area is curved, and due to this, the specific situation in which the non-detection area exists on a detection line that joins a part of the detection area and the obstacle sensor may arise. In this sort of specific situation, when there is a shield in the non-detection area, a situation can arise in which an undetectable area where an obstacle cannot be detected exists in the detection area due to existence of the shield. If an obstacle exists in such an undetectable area, it is possible that the article transport vehicle will contact the obstacle because the obstacle cannot be detected in advance by the obstacle sensor. However, according to the present configuration, in a state where the article transport vehicle is traveling at the first traveling speed, in the specific situation, and a situation where an undetectable area exists in the detection area because a shield exists in the non-detection area, regardless of whether or not an obstacle actually exists in the undetectable area, the traveling speed of the article transport vehicle is reduced from the first traveling speed to the second traveling speed. Therefore, even if an obstacle exists in the undetectable area, it is possible to swiftly stop the article transport vehicle. In other words, the article transport vehicle can be appropriately controlled such that the article transport vehicle avoids contacting the obstacle.

Here, it is suitable to adopt a configuration in which the control unit causes the article transport vehicle to travel at the first traveling speed when the obstacle is not detected in the detection area, and reduces the speed of the article transport vehicle to a third traveling speed slower than the first traveling speed when the obstacle is detected in the detection area.

According to this configuration, when an obstacle is detected in the detection area, the speed of the article transport vehicle is reduced from the first traveling speed to the third traveling speed. Thus, when there is a possibility that the article transport vehicle will contact an obstacle, it is possible to swiftly stop the article transport vehicle, so it is possible for the article transport vehicle to avoid contacting the obstacle. On the other hand, when an obstacle is not detected in the detection area, the speed of the article transport vehicle is not reduced and the article transport vehicle is allowed to travel at the first traveling speed, so it is possible to allow the article transport vehicle to travel swiftly to a target location. Note that the third traveling speed may be the same as the second traveling speed above, or may be a different traveling speed.

Also, it is suitable to adopt a configuration in which a distance along the traveling path from the article transport vehicle to the obstacle detected in the detection area is defined as an obstacle detection distance, and the control unit sets the third traveling speed such that the third traveling speed decreases as the obstacle detection distance becomes shorter.

According to this configuration, in a state where an obstacle is being detected in the detection area, when the obstacle detection distance is long, it is possible for the article transport vehicle to travel at a comparatively high speed and avoid reducing the traveling speed of the article transport vehicle more than necessary, so the article transport vehicle can easily arrive early at the target location. When the obstacle detection distance is short, the traveling speed of the article transport vehicle is sufficiently reduced, so it is possible to appropriately stop the article transport vehicle before the article transport vehicle contacts the obstacle.

Also, it is suitable to adopt a configuration in which a distance along the traveling path from the article transport vehicle to the undetectable area is defined as an undetectable distance, and the control unit sets the second traveling speed such that the second traveling speed decreases as the undetectable distance becomes shorter.

According to this configuration, when the undetectable distance is long, it is possible for the article transport vehicle to travel at a comparatively high speed and avoid reducing the traveling speed of the article transport vehicle more than necessary, so the article transport vehicle can easily arrive early at the target location. When the undetectable distance is short, the traveling speed of the article transport vehicle is sufficiently reduced, so it is possible to appropriately stop the article transport vehicle even if an obstacle exists in the undetectable area.

Also, it is suitable to adopt a configuration in which the control unit sets the detection area by changing the shape of the detection area as needed according to the shape of the traveling path on the front side of the article transport vehicle.

According to this configuration, by changing the shape of the detection area as needed according to the shape of the traveling path, it is possible to appropriately detect an obstacle on the traveling path on the front side of the article transport vehicle, and it is possible to easily avoid erroneously detecting an object that exists in an area outside the planned traveling locus of the article transport vehicle and has no possibility of contacting the article transport vehicle as an obstacle.

Also, it is suitable to adopt a configuration in which the control unit sets the detection area such that the length of the detection area along the traveling path increases as the traveling speed of the article transport vehicle increases.

According to this configuration, an obstacle can be detected from a greater distance as the traveling speed increases. Therefore, when an obstacle is not detected by the obstacle sensor, the traveling speed of the article transport vehicle is increased, so the article transport vehicle can easily arrive early at the target location, and also, the article transport vehicle can appropriately avoid contacting the obstacle.

Also, it is suitable to adopt a configuration in which the control unit, when stopping the article transport vehicle at a prescribed stopping position, sets the length of the detection area along the traveling path to the length from the obstacle sensor to the stopping position.

When stopping the article transport vehicle at a prescribed stopping position, even if there is an obstacle ahead of the stopping position, there is no possibility that the article transport vehicle will contact the obstacle until the article transport vehicle continues to proceed from the stopping position. According to this configuration, when stopping the article transport vehicle at a prescribed stopping position, the length of the detection area along the traveling path is set to the length from the obstacle sensor to the stopping position, so an obstacle ahead of the stopping position is not detected by the obstacle sensor. Therefore, it is possible to prevent the article transport vehicle from unnecessarily decelerating, and the article transport vehicle can easily arrive early at the target location.

INDUSTRIAL APPLICABILITY

The technology according to the present disclosure is applicable to an article transport facility including an article transport vehicle that travels along a traveling path, thereby transporting an article.

What is claimed is:

1. An article transport facility, comprising:
an article transport vehicle that travels along a traveling path, thereby transporting an article; and
wherein:
the article transport vehicle is provided with an obstacle sensor that detects an obstacle that exists in a detection area set according to the shape of a planned traveling locus on the front side of the article transport vehicle, and a control unit that controls the traveling speed of the article transport vehicle based on detection information of the obstacle sensor,
a non-detection area where detection of the obstacle by the obstacle sensor is not performed is set in an area within the detectable area of the obstacle sensor and outside the planned traveling locus,
a situation in which the non-detection area exists on a detection line that joins a part of the detection area and the obstacle sensor because the detection area is curved is defined as a specific situation, and
the control unit, in a state where the article transport vehicle is traveling at the first traveling speed, in the specific situation, and a situation where an undetectable area in which it is not possible to detect the obstacle exists in the detection area because a shield exists in the non-detection area, reduces the speed of the article transport vehicle to a second traveling speed slower than the first traveling speed.

2. The article transport facility according to claim 1, wherein the control unit causes the article transport vehicle to travel at the first traveling speed when the obstacle is not detected in the detection area, and reduces the speed of the article transport vehicle to a third traveling speed slower than the first traveling speed when the obstacle is detected in the detection area.

3. The article transport facility according to claim 2, wherein a distance along the traveling path from the article transport vehicle to the obstacle detected in the detection area is defined as an obstacle detection distance, and
wherein the control unit sets the third traveling speed such that the third traveling speed decreases as the obstacle detection distance becomes shorter.

4. The article transport facility according to claim 1, wherein a distance along the traveling path from the article transport vehicle to the undetectable area is defined as an undetectable distance, and
wherein the control unit sets the second traveling speed such that the second traveling speed decreases as the undetectable distance becomes shorter.

5. The article transport facility according to claim 1, wherein the control unit sets the detection area by changing the shape of the detection area as needed according to the shape of the traveling path on the front side of the article transport vehicle.

6. The article transport facility according to claim 1, wherein the control unit sets the detection area such that the length of the detection area along the traveling path increases as the traveling speed of the article transport vehicle increases.

7. The article transport facility according to claim 1, wherein the control unit, when stopping the article transport vehicle at a prescribed stopping position, sets the length of the detection area along the traveling path to the length from the obstacle sensor to the stopping position.

* * * * *